(12) United States Patent
Ning et al.

(10) Patent No.: US 9,250,538 B2
(45) Date of Patent: Feb. 2, 2016

(54) EFFICIENT OPTICAL PROXIMITY CORRECTION REPAIR FLOW METHOD AND APPARATUS

(71) Applicant: GLOBALFOUNDRIES Inc., Grand Cayman (KY)

(72) Inventors: Guoxiang Ning, Ballston Lake, NY (US); Christopher Spence, Los Altos, CA (US); Paul Ackmann, Gansevoort, NY (US); Chin Teong Lim, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/146,771

(22) Filed: Jan. 3, 2014

(65) Prior Publication Data

US 2015/0192866 A1   Jul. 9, 2015

(51) Int. Cl.
*G06F 17/50* (2006.01)
*G03F 7/20* (2006.01)
*G03F 1/70* (2012.01)

(52) U.S. Cl.
CPC .............. *G03F 7/70441* (2013.01); *G03F 1/70* (2013.01)

(58) Field of Classification Search
CPC ... G03F 1/36; G03F 7/70441; G06F 2217/12; G06F 17/5068; G06F 17/5081; G06F 17/50; G06F 17/5045
USPC .......................................................... 716/53
See application file for complete search history.

(56) References Cited

U.S. PATENT DOCUMENTS

| | | | | |
|---|---|---|---|---|
| 7,281,222 | B1 * | 10/2007 | Babcock | 716/53 |
| 7,926,002 | B2 | 4/2011 | Word et al. | |
| 2006/0236271 | A1 * | 10/2006 | Zach | 716/1 |
| 2010/0333049 | A1 * | 12/2010 | Agarwal et al. | 716/55 |

OTHER PUBLICATIONS

Chin Teong Lim et al.,"Investigation of DFM-Lite ORC Approach During OPC Simulation", Optical Microlithography XX., Proceedings fo the SPIE, vol. 6520, article id. 65204E, (2007), 12 pages.

* cited by examiner

*Primary Examiner* — Jack Chiang
*Assistant Examiner* — Brandon Bowers
(74) *Attorney, Agent, or Firm* — Ditthavong & Steiner, P.C.

(57) ABSTRACT

A method and apparatus for an efficient optical proximity correction (OPC) repair flow is disclosed. Embodiments may include receiving an input data stream of an integrated circuit (IC) design layout, performing one or more iterations of an OPC step and a layout polishing step on the input data stream, and performing a smart enhancement step if an output of a last iteration of the OPC step fails to satisfy one or more layout criteria and if a number of the one or more iterations satisfies a threshold value. Additional embodiments may include performing a pattern insertion process cross-linked with the OPC step, the pattern insertion process being a base optical rule check (ORC) process.

13 Claims, 6 Drawing Sheets

EFFICIENT OPTICAL PROXIMITY CORRECTION REPAIR FLOW METHOD AND APPARATUS

TECHNICAL FIELD

The present disclosure relates to reticle enhancement techniques in the photolithographic manufacture of semiconductor devices. The present disclosure is particularly applicable to optical proximity correction (OPC) in the preparation of layout design data used to create a mask.

BACKGROUND

Layout design data must be corrected to compensate for image errors due to light diffraction or process effects. OPC refers to a resolution enhancement technique utilized to change a mask pattern in order to maintain the integrity of the original design. FIG. 1 illustrates a conventional repair flow 100 utilizing separate OPC and optical rule check (ORC) processes for optical verification. The input to the repair flow 100 is a binary layout design data (e.g., GDSin). A retargeting (e.g., global bias correction) is first performed (step 101). Following the retargeting, dummy pattern or assist feature enhancements are made to the layout design data (step 103). Next, isolated or nested patterns in the layout design data are corrected for selectivity bias (step 105). In step 107, an OPC process is executed to generate the output layout design data 109 (e.g., GDSout). If the output layout design data 109 fails to satisfy an optical verification process (step 111), the output layout design data 109 or the OPC process recipe is modified offline (step 113) and fed back into the repair flow 100 for another iteration of steps 101 through 111. The optical verification process in a conventional repair flow typically utilizes critical dimension (CD) as a measure of the output quality.

The repair flow 100 is expensive in terms of both computing resources and processing time. Layout designs can be very large, running into the gigabytes. Performing an OPC process even once on a design is computationally intensive. Repeating the OPC process to correct remaining potential print errors adds significant time to finalize the layout design. In addition, it is well known that CD is an insufficient measure when determining potential errors in the layout data. This is especially true for off-nominal process conditions.

A need therefore exists for a high quality and efficient repair flow methodology and apparatus that reduces OPC overall cycle times.

SUMMARY

An aspect of the present disclosure is an iterative OPC process that is cross-linked to or interfaces with an ORC process.

Another aspect of the present disclosure is the insertion of a layout polishing step during the iterative OPC process.

Another aspect of the present disclosure is the insertion of pattern classification (e.g., pattern matching) algorithm and compensation table during the iterative OPC process.

Another aspect of the present disclosure is the usage of optical parameters alone or in combination with a critical dimension parameter to detect potential print errors.

Another aspect of the present disclosure is the correction of remaining potential print errors by a smart enhancement technique.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of correcting layout design data, the method including: receiving an input data stream of an integrated circuit (IC) design layout, performing one or more iterations of an OPC step and a layout polishing step on the input data stream, and performing a smart enhancement step if an output of a last iteration of the OPC step fails to satisfy one or more layout criteria and if a number of the one or more iterations satisfies a threshold value.

Aspects of the present disclosure include cross-linking a base ORC process with the OPC step and including pattern classification during the one or more iterations of the OPC step. Further aspects include the pattern classification being based on a pattern matching database or one or more compensation tables. Additional aspects include performing an additional OPC step after the smart enhancement step and performing an additional smart enhancement step if an output of the additional OPC step fails to satisfy the one or more layout criteria. Further aspects include the smart enhancement step including a sub-resolution assist feature (SRAF) process, a smart filling process, or a combination thereof, and the additional smart enhancement step includes an inverse lithography technology (ILT) process. Additional aspects include the one or more layout criteria including one or more optical parameters or their mathematical derivatives, the one or more optical parameters including a maximum intensity, a minimum intensity, a curvature, a contrast, a slope, a normalized image log slope (NILS), a classified threshold on resist profile, or a combination thereof. Further aspects include the smart enhancement step including an ILT process. Additional aspects include the threshold value being an integer greater than one. Further aspects include the layout polishing step performing a selective biasing step on one or more out-of-criteria layout portions of an output generated by the OPC step.

Another aspect of the present disclosure is an apparatus including at least one processor; and at least one memory including computer program code for one or more programs, the at least one memory and the computer program code configured to, with the at least one processor, cause the apparatus to perform at least the following: receive an input data stream of an IC design layout, perform one or more iterations of an OPC step and a layout polishing step on the input data stream, and perform a smart enhancement step if an output of a last iteration of the OPC step fails to satisfy one or more layout criteria and if a number of the one or more iterations satisfies a threshold value.

Aspects include cross-linking a base ORC process with the OPC step and including pattern classification during the one or more iterations of the OPC step. Further aspects include the pattern classification being based on a pattern matching database or one or more compensation tables. Additional aspects include performing an additional OPC step after the smart enhancement step and performing an additional smart enhancement step if an output of the additional OPC step fails to satisfy the one or more layout criteria. Further aspects include the smart enhancement step including a sub-resolution assist feature (SRAF) process, a smart filling process, or a combination thereof, and the additional smart enhancement step includes an inverse lithography technology (ILT) process. Additional aspects include the one or more layout criteria including one or more optical parameters or their mathematical derivatives, the one or more optical parameters including a maximum intensity, a minimum intensity, a curvature, a contrast, a slope, a NILS, a classified threshold on resist profile, or a combination thereof. Further aspects include the smart enhancement step including an ILT process. Additional aspects include the threshold value being an integer greater than one. Further aspects include the layout polishing step performing a selective biasing step on one or more out-of-criteria layout portions of an output generated by the OPC step.

Another aspect of the present disclosure is a method of correcting layout design data, the method including: receiving an input data stream of an IC design layout, performing one or more iterations of an OPC step and a layout polishing step on the input data stream, performing a smart enhancement step if an output of a last iteration of the OPC step fails to satisfy one or more layout criteria and if a number of the one or more iterations satisfies a threshold value, performing an additional OPC step after the smart enhancement step, and performing an additional smart enhancement step if an output of the additional OPC step fails to satisfy the one or more layout criteria, the one or more layout criteria including one or more optical parameters and the threshold value being an integer greater than one.

Additional aspects include performing a pattern insertion process cross-linked with the OPC step, the pattern insertion process being a base ORC process.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of inefficient preparation of layout data attendant upon OPC repair flows. In accordance with embodiments of the present disclosure, an OPC process is integrated within one or more repair loops and skips an independent optical verification step. The optimization benefits are applicable to either one-dimensional (1D) or two-dimensional (2D) structures. The optimization benefits are particularly applicable to 2D structures.

Methodology in accordance with embodiments of the present disclosure includes: receiving an input data stream of an IC design layout, performing one or more iterations of an OPC step and a layout polishing step on the input data stream, and performing a smart enhancement step if an output of a last iteration of the OPC step fails to satisfy one or more layout criteria and if a number of the one or more iterations satisfies a threshold value.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
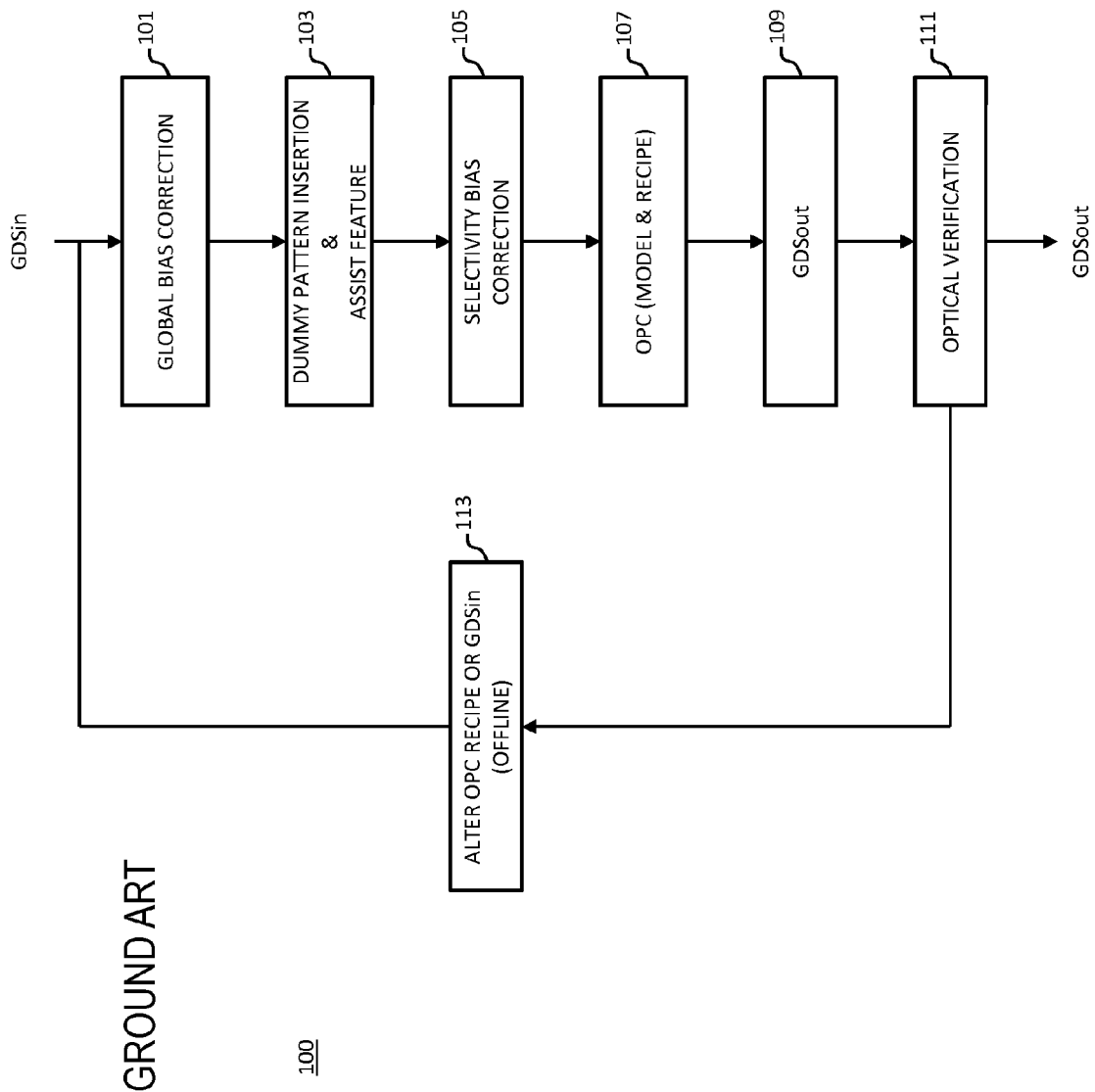
FIG. 1 schematically illustrates a conventional repair flow.
Figure 2:
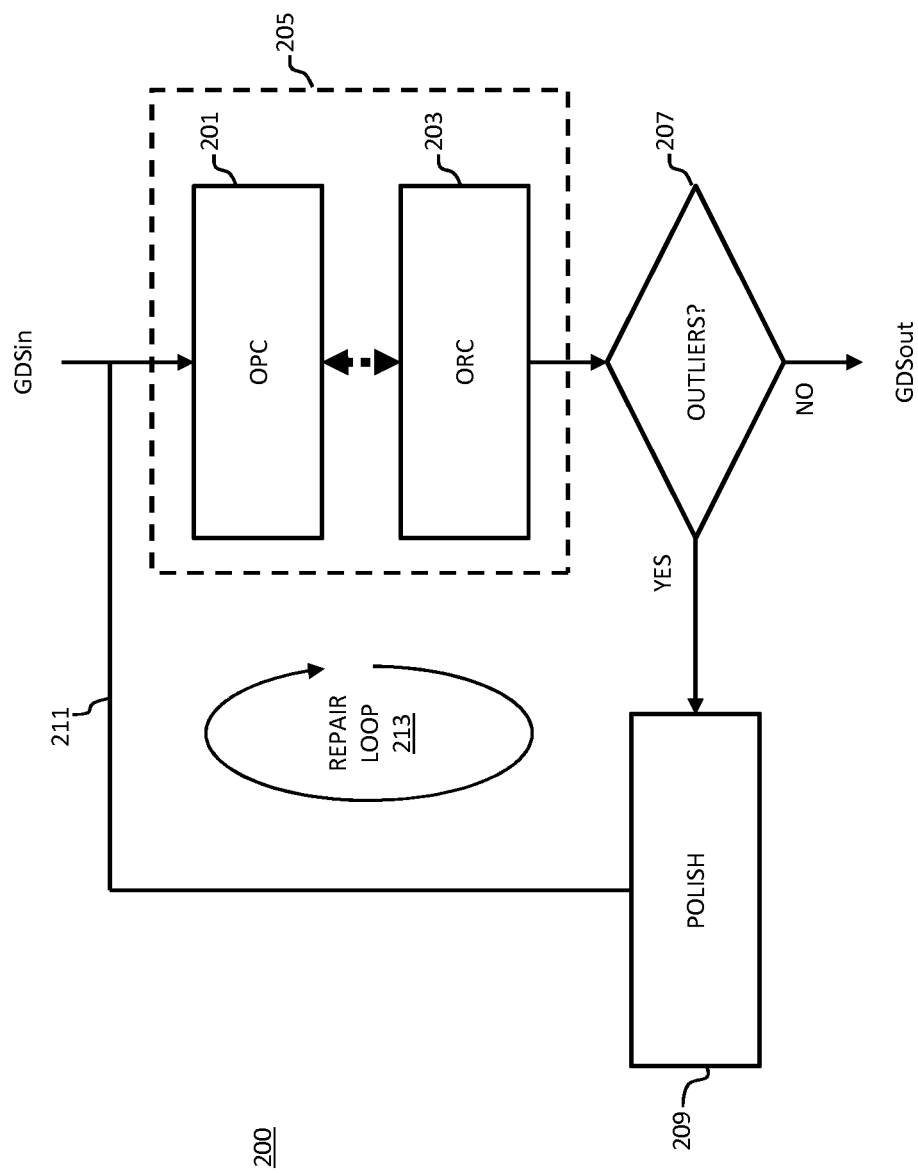
FIG. 2 schematically illustrates an efficient repair flow, according to an exemplary embodiment.

FIG. 2 illustrates a repair flow 200, in accordance with an exemplary embodiment. Instead of relying on CD values, the repair flow 200 utilizes optical parameters to determine potential print errors. An input layout design (e.g., GDSin) is passed to an OPC process (step 201). The repair flow 200 is arranged such that the OPC process in step 201 cross-links or interfaces with a simplified ORC process (step 203). As used herein, the terms "cross-link" or "interface" may be used to describe the relationship between the individual OPC and ORC steps in the combined OPC-ORC process 205. The ORC process of step 203 is a simplified ORC process that primarily interprets the dataset generated by the OPC process of step 201 and, if necessary, supplements the dataset with a minimal set of additional ORC adjustments. For instance, the ORC process of step 203 may perform an advanced layout manipulation to minimize potential print errors by pattern classification techniques. The additional ORC dataset may be skipped if the OPC process of step 201 is robust enough to generate a sufficiently high quality dataset. Cross-linking the OPC and ORC processes in this fashion streamlines the overall repair flow process and reduces the computing time because the repair flow 200 does not require an additional, fully independent, ORC process.

In an outlier checking step 207, the output of the cross-linked OPC-ORC process 205 is analyzed to determine whether it contains any outliers. Specifically, it is determined whether the layout design data satisfies various criteria associated with certain optical parameters. The optical parameters may be related to an exposure radiation dose and may include light intensity (I), NILS, contrast, curvature, a classified threshold on resist profile, etc. For example, the light intensity may be expressed as a function of the minimum light intensity ($I_{min}$), maximum light intensity ($I_{max}$), curvature, and slope, and the outlier checking step 207 may involve evaluating the output of a mathematical function $f(x)$ relating the optical parameters, where $f(x)=f(I_{min}, I_{max},$ curvature, slope . . . ). The mathematical function may also include first or second derivatives of the optical parameters. For example, derivatives of the light intensity with respect to distance (e.g., dI/dx, $d^2I/dx^2$) may be utilized in the mathematical function to identify various design flaws or weaknesses (e.g., sloppy profile, resist top loss, etc.). Linear combinations of first, second, and higher order derivatives of optical parameters are particularly useful in checking for outliers.

If the layout design data contains outliers, then one or more portions of the layout design data may be corrected by a polishing process (e.g., layout manipulation with special algorithm, selective bias correction, etc.) (step 209), and the polished output may be fed back into the OPC process (step 211). If no outliers are found, the repair flow 200 terminates, and the output layout design data is generated (e.g., GDSout).

The cross-linked OPC-ORC process 205, outlier checking step 207, and polishing step 209, may be combined into an iterative repair loop 213. For most 1D and 2D layout scenarios, the repair flow 200 is not needed. In the remaining cases, the repair flow 200 will terminate after a first iteration of the repair loop 213. Additional iterations, if needed, may lead to the discovery of additional outliers and may be corrected based on further polishing. The maximum number of iterations of the repair loop 213 may be established by the repair flow programmer. For example, it may be set to an integer value N (where N=2, 3, 4 . . . ). The repair flow 200 is particularly applicable to 2D structures. The majority (e.g., 98-100%) of the layout design data for a particular 2D design will be found to pass the cross-linked OPC-ORC process 205 before a first iteration of the repair loop 213.

Figure 3A:
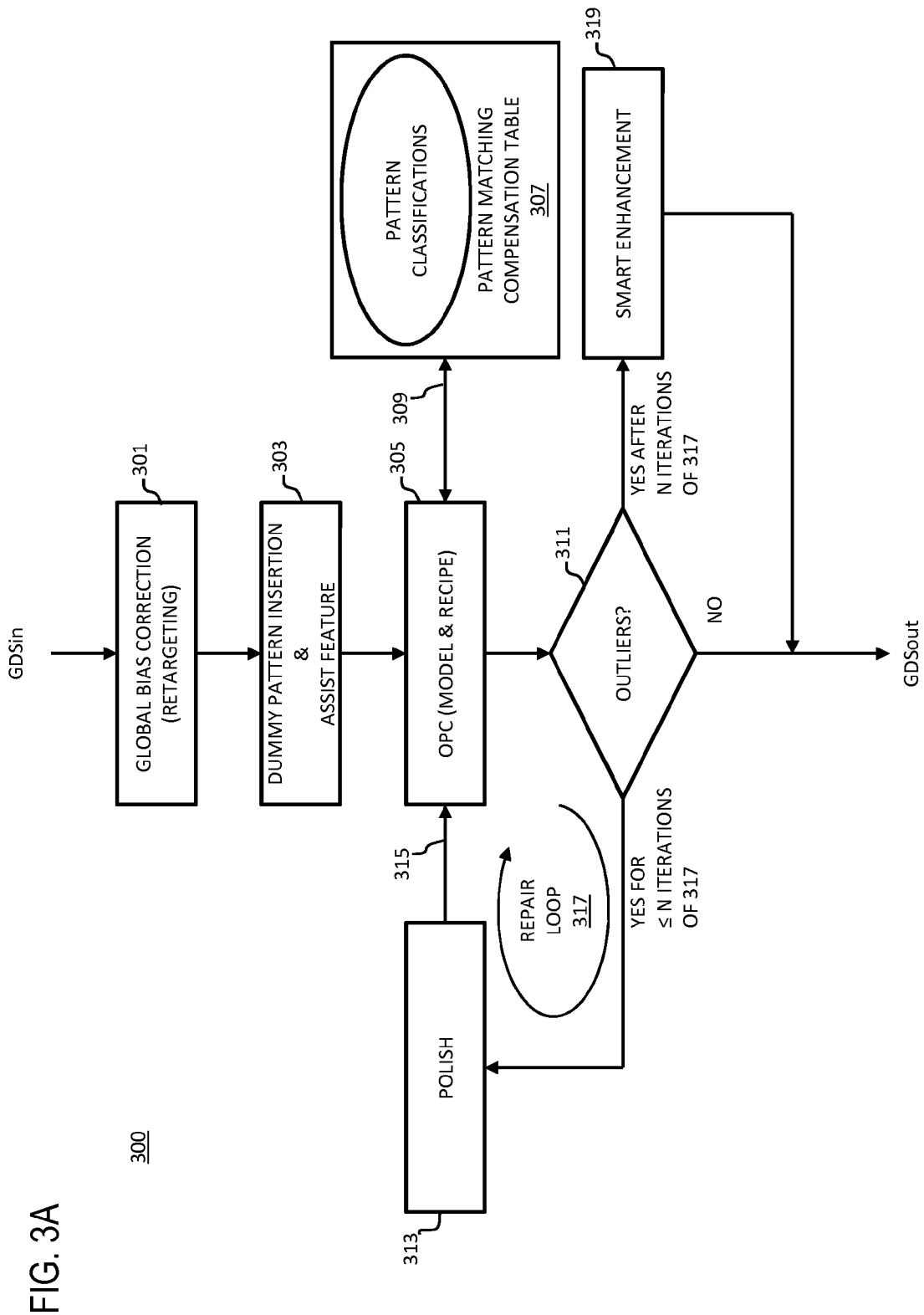
FIGS. 3A and 3B schematically illustrate an efficient single-loop repair flow, according to an exemplary embodiment.

FIG. 3A schematically illustrates a single-loop repair flow 300 employing a rule-based assist feature, according to an exemplary embodiment. A layout design data file (e.g., GDSin) is input to the repair flow, retargeted for global bias correction (step 301), and enhanced with a dummy pattern insertion and a rule-based assist feature process (step 303) before being input to a model and recipe-based OPC process (step 305). The OPC process 305 may interface or cross-link with a pattern matching database or a pattern matching compensation table 307 to perform a minimal or base ORC process on the datasets generated by the OPC process (step 309). The cross-linked OPC-pattern insertion processes improve the dataset generated by the OPC process and reduce potential print errors.

The output of the OPC process 305 is checked for outliers based on one or more optical parameters (step 311). If outliers are present, they are fixed by polishing (step 313), and the polished layout design data is fed back into the OPC process (step 315). The OPC, criteria checking, and polishing steps may be combined to form an iterative repair loop 317. The repair loop 317 may be iterated until either all outliers have been corrected or a threshold integer value N (where N=2, 3, 4 . . . ) for the number of loop iterations is satisfied, whichever occurs first. If outliers persist after N iterations, a smart enhancement process (e.g., ILT) may be utilized to correct the remaining errors (step 319). Smart enhancement techniques such as, for example, ILT may be selectively targeted at particular portions of the layout data so as to not increase the overall run time of the repair flow 300.

Figure 3B:
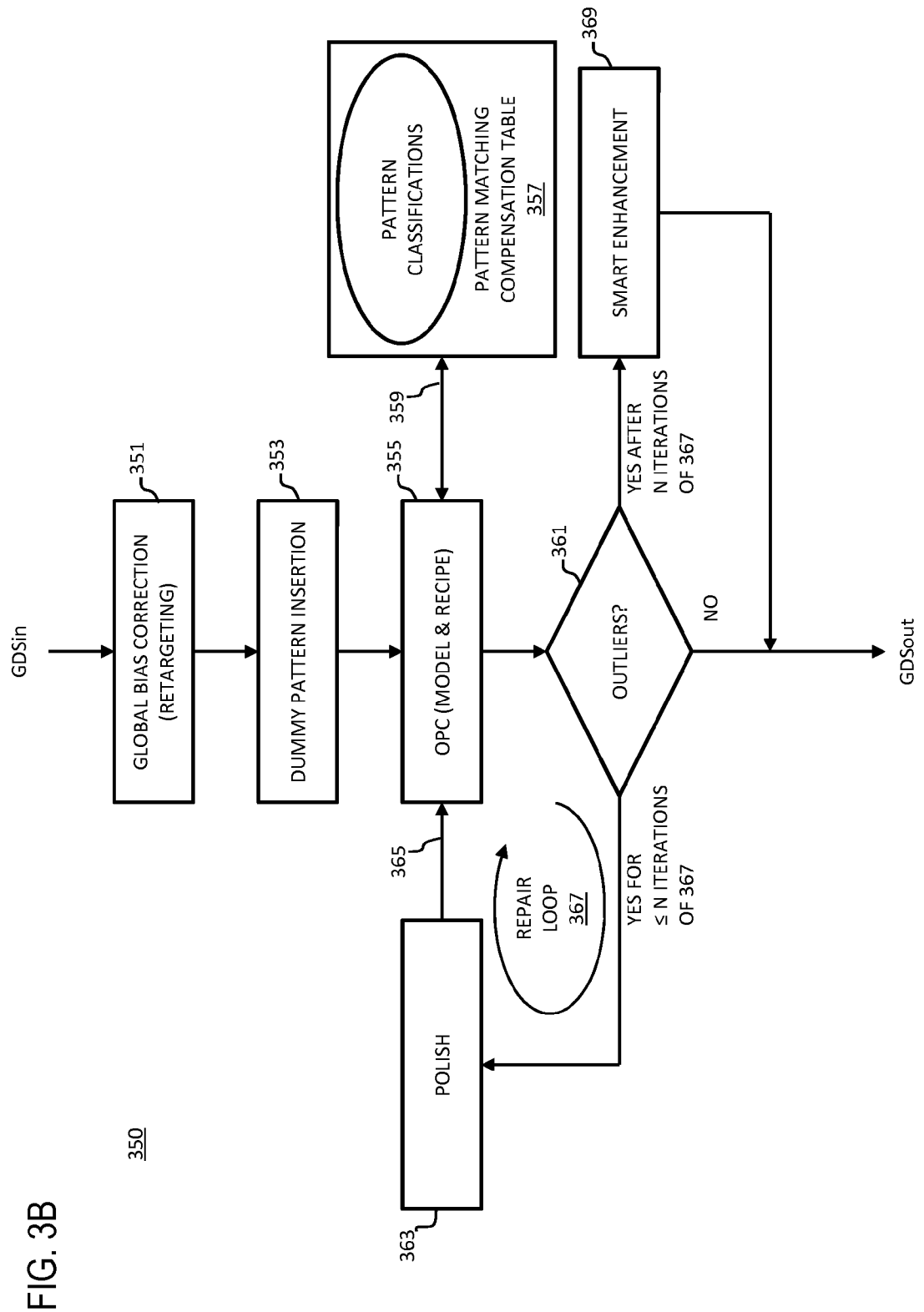

FIG. 3B schematically illustrates a single-loop repair flow 350 employing a model-based assist feature, according to an exemplary embodiment. A layout design data file (e.g., GDSin) is input to the repair flow and retargeted for global bias correction via retargeting (step 351). After the global bias correction, the layout data is enhanced with a dummy pattern insertion (step 353) before being input to a model-based OPC process that includes model-based SRAF and OPC recipe (step 355). The OPC process may cross-link or interface with a pattern matching database or a compensation table 357 to perform a minimal or base ORC process on the datasets generated by the OPC process (step 359). The cross-linked OPC-pattern insertion processes improve the dataset generated by the OPC process and reduce potential print errors.

As in the case of the repair flow 300, the output of the OPC process is checked for outliers based on one or more optical parameters (step 361). If outliers are present, they are fixed by polishing (step 363), and the polished layout design data is fed back into the OPC process (step 365). The OPC, criteria checking, and polishing steps may be combined to form an iterative repair loop 367. The repair loop 367 may be iterated until either all outliers have been corrected or a threshold integer value N (where N=2, 3, 4 . . . ) for the number of loop iterations is satisfied, whichever occurs first. If outliers persist after N iterations, a smart enhancement process (e.g., ILT) may be utilized to correct the remaining errors (step 369). Smart enhancement techniques such as ILT may be selectively targeted at particular portions of the layout data so as to not increase the overall run time of the repair flow 350.

Figure 4A:
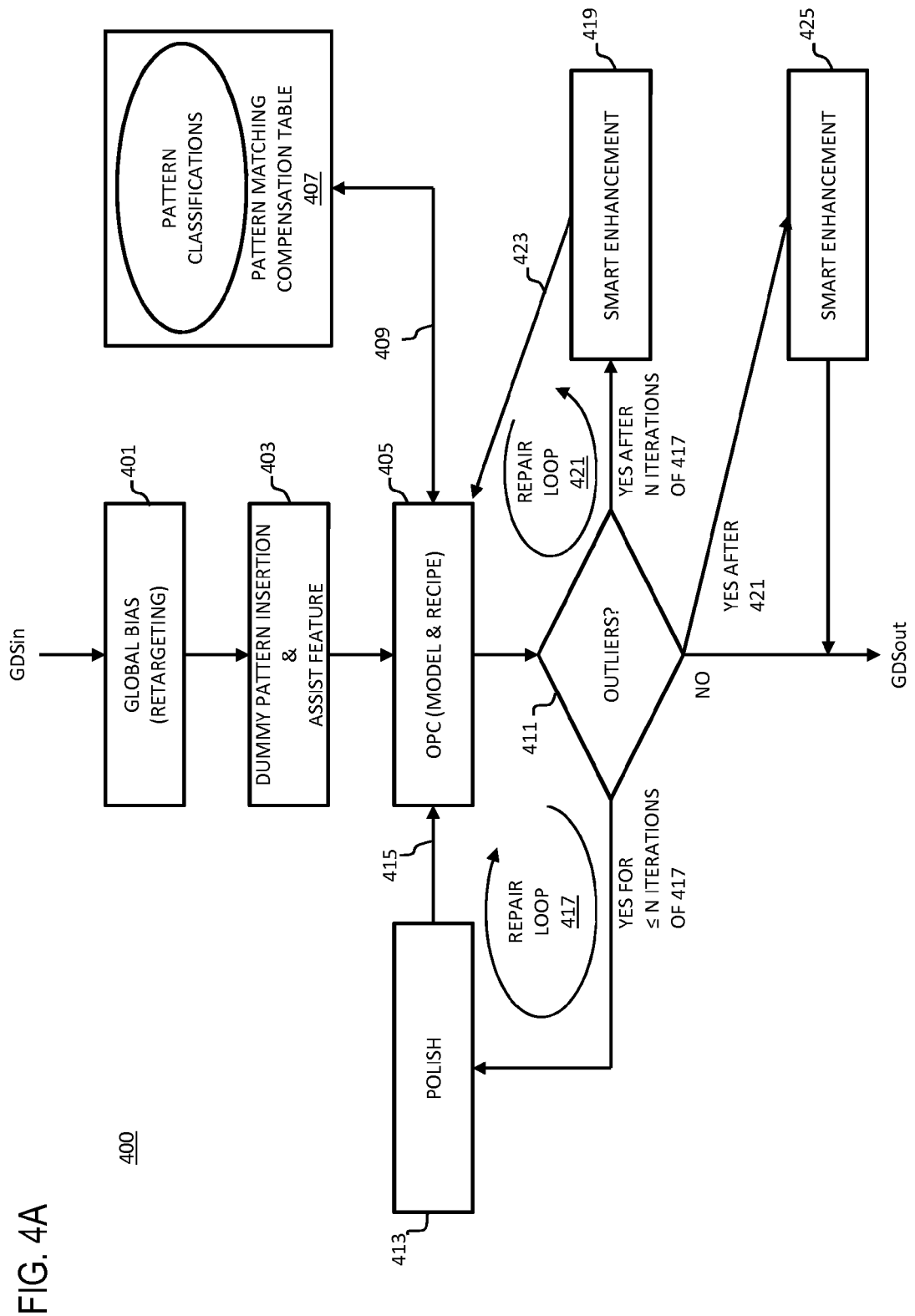
FIGS. 4A and 4B schematically illustrate an efficient dual-loop repair flow, according to an exemplary embodiment.
Figure 4B:
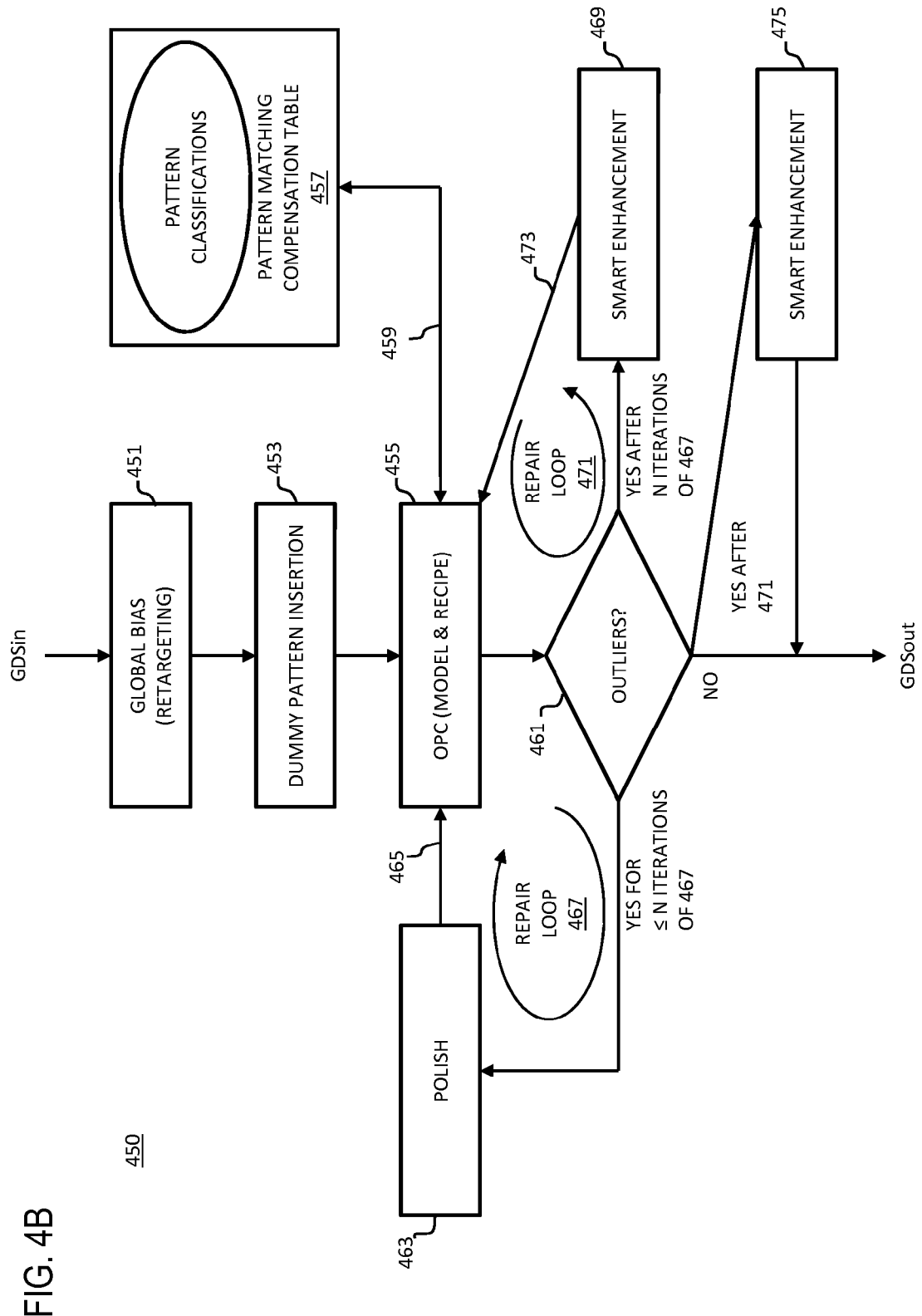

Although the single-loop repair flows 300 and 350 reduce the overall execution time, the run-time of the OPC process may be further reduced by employing an additional smart enhancement process in a second repair loop. The first repair loop may utilize a layout polishing process and the second repair loop may utilize a smart enhancement process to correct outliers. The additional smart enhancement process reduces the number of outliers that will require a more compute-intensive smart enhancement loop. The repair flow may be programmed to execute the second repair loop after a programmable number of iterations of the first repair loop. FIGS. 4A and 4B schematically illustrate dual-loop repair flows, according to exemplary embodiments of the present disclosure.

FIG. 4A schematically illustrates a dual-loop repair flow 400 employing a rule-based assist feature, according to an exemplary embodiment. As in the case of the single-loop repair flow 300, a layout design data file (e.g., GDSin) is input to the repair flow 400, retargeted for global bias correction (step 401), enhanced with a dummy pattern insertion and a rule-based assist feature process (step 403) before being input to a model and recipe-based OPC process (step 405). The OPC process may cross-link or interface with a pattern matching database or a compensation table 407 to perform a minimal or base ORC process on the datasets generated by the OPC process (step 409). The cross-linked OPC-pattern insertion processes improve the dataset generated by the OPC process and reduce potential print errors.

The output of the OPC process is checked for outliers based on one or more optical parameters (step 411). If outliers are present, they are fixed by polishing (step 413), and the polished layout design data is fed back into the OPC process (step 415). The OPC, criteria checking, and polishing steps may be combined to form an iterative first repair loop 417. The first repair loop 417 may be iterated until either all outliers have been corrected or a threshold integer value N (where N=2, 3, 4 . . . ) for the number of loop iterations is satisfied, whichever occurs first. The OPC and criteria checking steps may also be combined with a first smart enhancement process 419 (e.g., model-based SRAF, smart filling) to form an iterative second repair loop 421. If outliers persist after N iterations of the first repair loop 417, the second repair loop 421 may be utilized to correct the outliers. Specifically, the output of the outlier checking step may be fed into the first smart enhancement process 419. The enhanced layout design data may then be fed back into the OPC process (step 423), and its output again checked for outliers. A single iteration of the second repair loop 421 may be sufficient to correct 99.9-100% of the layout design data. If outliers persist even after an iteration of the second repair loop 421, a second smart enhancement process 425 (e.g., ILT) may be utilized to produce the output layout data (e.g., GDSout).

FIG. 4B schematically illustrates a dual-loop repair flow 450 employing a model-based assist feature, according to an exemplary embodiment. As in the case of the single-loop repair flow 350, a layout design data file (e.g., GDSin) is input to the repair flow and retargeted for global bias correction (step 451). After global bias correction, the layout design data is enhanced with a dummy pattern insertion process (step 453) before being input to a model-based OPC process that includes model-based SRAF and OPC recipe (step 455). The OPC process may cross-link or interface with a pattern matching database or a compensation table 457 to perform a minimal or base ORC process on the datasets generated by the OPC process (step 459). The cross-linked OPC-pattern insertion processes improve the dataset generated by the OPC process and reduce potential print errors.

The output of the OPC process is checked for outliers based on one or more optical parameters (step 461). If outliers are present, they are fixed by polishing (step 463), and the polished layout design data is fed back into the OPC process (step 465). The OPC, criteria checking, and polishing steps may be combined to form an iterative first repair loop 467. The first repair loop 467 may be iterated until either all outliers have been corrected or a threshold integer value N (where N=2, 3, 4 . . . ) for the number of loop iterations is satisfied, whichever occurs first. The OPC and outlier checking steps may also be combined with a first smart enhancement process 469 (e.g., model-based SRAF, smart filling) to form an iterative second repair loop 471. If outliers persist after N iterations of the first repair loop 467, the second repair loop 471 may be utilized to correct the outliers. Specifically, the output of the outlier checking step may be fed into the first smart enhancement process 469. The enhanced layout design data may then be fed back into the OPC process (step 473), and its output again checked for outliers. A single iteration of the second repair loop 471 may be sufficient to correct 99.9-100% of the layout data. If outliers persist even after an iteration of the second repair loop 471, a second smart enhancement process 475 (e.g., ILT) may be utilized to produce the output layout data (e.g., GDSout).

The embodiments of the present disclosure can achieve several technical effects, including reduced execution time for an OPC repair flow obtained by elimination of a full independent ORC process from the OPC repair flow and not requiring manual layout manipulation and offline OPC recipe fixes. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 20 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A computer-implemented method comprising:
   receiving, by way of a processor, an input data stream of an integrated circuit (IC) design layout;
   correcting, by the processor, identified outliers in the IC design layout by way of an iterative repair loop comprising steps of:
      performing one or more iterations of an optical proximity correction (OPC) step and a layout polishing step on the input data stream;
   performing, by the processor, a smart enhancement step if an output of a last iteration of the OPC step fails to satisfy one or more layout criteria and if a number of the one or more iterations satisfies a threshold value, the smart enhancement step comprising an inverse lithography technology (ILT) process;
   cross-linking, by the processor, a base optical rule check (ORC) process with the OPC step; and
   performing, by the processor, pattern classification during the one or more iterations of the OPC step,
   wherein the pattern classification is based on a pattern matching database or one or more compensation tables.

2. The method according to claim 1, further comprising:
   performing an additional OPC step after the smart enhancement step; and
   performing an additional smart enhancement step if an output of the additional OPC step fails to satisfy the one or more layout criteria.

3. The method according to claim 2, wherein the smart enhancement step comprises a sub-resolution assist feature (SRAF) process, a smart filling process, or a combination thereof, and the additional smart enhancement step comprises an inverse lithography technology (ILT) process.

4. The method according to claim 1, wherein the one or more layout criteria comprise one or more optical parameters or their mathematical derivatives, the one or more optical parameters including a maximum intensity, a minimum intensity, a curvature, a contrast, a slope, a normalized image log slope (NILS), a classified threshold on resist profile, or a combination thereof.

5. The method according to claim 1, wherein the threshold value is an integer greater than one.

6. The method according to claim 1, wherein the layout polishing step performs a selective biasing step on one or more out-of-criteria layout portions of an output generated by the OPC step.

7. An apparatus comprising:
   at least one processor; and
   at least one memory including computer program code for one or more programs, the at least one memory and the computer program code configured to, with the at least one processor, cause the apparatus to perform at least the following:
   receiving an input data stream of an integrated circuit (IC) design layout;
   correcting identified outliers in the IC design layout by way of an iterative repair loop comprising steps of:
      performing one or more iterations of an optical proximity correction (OPC) step and a layout polishing step on the input data stream;
   performing a smart enhancement step if an output of a last iteration of the OPC step fails to satisfy one or more layout criteria and if a number of the one or more iterations satisfies a threshold value, the smart enhancement step comprising an inverse lithography technology (ILT) process;

cross-linking, by the processor, a base optical rule check (ORC) process with the OPC step; and performing, by the processor, pattern classification during the one or more iterations of the OPC step, wherein the pattern classification is based on a pattern matching database or one or more compensation tables.

8. The apparatus according to claim 7, wherein the apparatus is further configured to:

perform an additional OPC step after the smart enhancement step; and perform an additional smart enhancement step if an output of the additional OPC step fails to satisfy the one or more layout criteria.

9. The apparatus according to claim 8, wherein the smart enhancement step comprises a sub-resolution assist feature (SRAF) process, a smart filling process, or a combination thereof, and the additional smart enhancement step comprises an inverse lithography technology (ILT) process.

10. The apparatus according to claim 7, wherein the one or more layout criteria comprise one or more optical parameters or their mathematical derivatives, the one or more optical parameters including a maximum intensity, a minimum intensity, a curvature, a contrast, a slope, a normalized image log slope (NILS), a classified threshold on resist profile, or a combination thereof.

11. The apparatus according to claim 7, wherein the threshold value is an integer greater than one.

12. The apparatus according to claim 7, wherein the layout polishing step performs a selective biasing step on one or more out-of-criteria layout portions of an output generated by the OPC step.

13. A computer-implemented method comprising:

receiving, by way of a processor, an input data stream of an integrated circuit (IC) design layout;

correcting, by the processor, identified outliers in the IC design layout by way of an iterative repair loop comprising steps of:

performing one or more iterations of an optical proximity correction (OPC) step and a layout polishing step on the input data stream;

performing, by the processor, a smart enhancement step if an output of a last iteration of the OPC step fails to satisfy one or more layout criteria and if a number of the one or more iterations satisfies a threshold value, the smart enhancement step comprising an inverse lithography technology (ILT) process;

performing, by the processor, an additional OPC step after the smart enhancement step;

performing, by the processor, an additional smart enhancement step if an output of the additional OPC step fails to satisfy the one or more layout criteria;

cross-linking, by the processor, a base optical rule check (ORC) process with the OPC step; and performing, by the processor, pattern classification during the one or more iterations of the OPC step, wherein the pattern classification is based on a pattern matching database or one or more compensation tables, and wherein the one or more layout criteria comprise one or more optical parameters and the threshold value is an integer greater than one.

* * * * *